(12) United States Patent
Leydier et al.

(10) Patent No.: US 8,138,566 B1
(45) Date of Patent: Mar. 20, 2012

(54) INTEGRATED CIRCUIT CHIP MADE SECURE AGAINST THE ACTION OF ELECTROMAGNETIC RADIATION

(75) Inventors: Robert A. Leydier, Orsay (FR); Béatrice Bonvalot, Bures sur Yvette (FR)

(73) Assignee: Gemalto SA, Meudon (FR)

( * ) Notice: Subject to any disclaimer, the term of this patent is extended or adjusted under 35 U.S.C. 154(b) by 0 days.

(21) Appl. No.: 09/807,686

(22) PCT Filed: Oct. 8, 1999

(86) PCT No.: PCT/FR99/02428
§ 371 (c)(1),
(2), (4) Date: Apr. 30, 2002

(87) PCT Pub. No.: WO00/24058
PCT Pub. Date: Aug. 27, 2000

(30) Foreign Application Priority Data

Oct. 16, 1998 (FR) ...................................... 98 13029

(51) Int. Cl.
*H01L 27/146* (2006.01)
(52) U.S. Cl. ............... 257/435; 438/48; 438/69; 438/70
(58) Field of Classification Search .................. 257/678, 257/679, 680, 681, 777, 921, 922, 294, 433, 257/434, 435, 726, 659
See application file for complete search history.

(56) References Cited

U.S. PATENT DOCUMENTS

| | | | | |
|---|---|---|---|---|
| 3,619,614 A | * | 11/1971 | Yamaka | 250/352 |
| 4,712,129 A | * | 12/1987 | Orcutt | 257/739 |
| 4,970,565 A | * | 11/1990 | Wu et al. | 257/318 |
| 5,213,989 A | * | 5/1993 | Fitch et al. | 438/365 |
| 5,394,014 A | * | 2/1995 | Ishikawa et al. | 257/790 |
| 5,534,056 A | * | 7/1996 | Kuehnle et al. | 106/455 |
| 5,714,802 A | * | 2/1998 | Cloud et al. | 257/726 |
| 5,804,827 A | | 9/1998 | Akagawa et al. | |
| 5,811,797 A | * | 9/1998 | Kobachi et al. | 250/239 |
| 5,877,547 A | | 3/1999 | Rhelimi | |
| 5,886,364 A | * | 3/1999 | Zhang | 257/53 |
| 6,229,165 B1 | * | 5/2001 | Sakai et al. | 257/291 |
| 6,245,663 B1 | * | 6/2001 | Zhao et al. | 438/622 |
| 6,369,448 B1 | * | 4/2002 | McCormick | 257/777 |

FOREIGN PATENT DOCUMENTS

| | | |
|---|---|---|
| JP | 10-270605 | 10/1990 |
| JP | 5047766 A | 2/1993 |
| JP | 10-270562 | 10/1998 |
| JP | 10270605 A | 10/1998 |

OTHER PUBLICATIONS

Japanese Patent Office, English translation of Office Action for Japanese counterpart of U.S. Appl. No: 09/807,686, Notification of reasons for Refusal, Ref. No. X11-0590, Application No. 2000-577713, Jul. 22, 2010.

* cited by examiner

*Primary Examiner* — Ajay K Arora
(74) *Attorney, Agent, or Firm* — Pehr B. Jansson; The Jansson Firm

(57) ABSTRACT

A chip for a chip-incorporating portable article having a card format, such as for smartcards. The chip includes a silicon substrate layer having integrated circuits in its active face defining a central processor unit and memories. The chip also includes physical means for providing physical protection against the action of electromagnetic radiation in the infrared range of wavelength longer than 1 μm.

29 Claims, 5 Drawing Sheets

INTEGRATED CIRCUIT CHIP MADE SECURE AGAINST THE ACTION OF ELECTROMAGNETIC RADIATION

CROSS-REFERENCE TO RELATED APPLICATIONS

This application is a U.S. National Phase Application under 35 USC 371 of International Application PCT/FR99/02428 (not published in English) filed Oct. 8, 1999.

FIELD OF THE INVENTION

The present invention relates to integrated circuit (IC) chips for incorporating in portable articles, in particular of card format.

BACKGROUND OF THE INVENTION

IC Cards are generally used in applications in which it is essential for confidential information to be stored and processed securely. By way of example, such applications lie in the fields of health, telephony, pay TV, or banking such as electronic purse applications.

Such cards comprise a plastics card body having an IC or chip device incorporated therein.

In the chip, the integrated circuit forms a complex assembly of logic cells over which a central processor unit (CPU) dispenses and controls information stored in RAM, ROM, or EEPROM type memories by means of a data bus and an address bus.

Conventionally, the logic cells are of the CMOS type. They are constituted by a P-type first MOS transistor and by an N-type second MOS transistor connected in a series and controlled by a common logic control signal resulting from the concomitant action of electrical signals present at the inputs of the circuit and of electrical signals generated by programs contained in the ROM or EEPROM memories or by associated electronic circuits. As a function of the logic control signal, charge distribution between valance and conduction bands is altered, thereby giving rise to controlled switching of said transistors.

Nevertheless, some energy sources can also modify this distribution. This applies in particular to electromagnetic radiation, in particular in ranges going from ultraviolet to infrared. As a result, using such radiation to illuminate a zone of the chip, e.g. a set of logic cells, can cause the transistors in said set of cells to switch independently of any electrical control ordered by the logic circuits.

That is why attackers, by taking a chip connected via its Vdd, Vss, Clock, I/O, and Reset pads, and by illuminating an appropriate zone of its circuits with focused electromagnetic radiation in the ultraviolet, visible, or infrared rant at time t chosen by them, have been able to cause the transistors in said zone to switch, thereby altering the normal sequencing of operations programmed in the memories of the chip, and have in particular been able to cause the chip to perform operations that are normally not authorized, thus giving access to secrets without destroying the circuits.

Known means for protecting integrated circuits against the action of electromagnetic radiation have nevertheless been developed. These comprise software means characterized by the fact that the programs in the ROM or EEPROM memories of the chip are numerous and associated with verification means. Nevertheless, those known means do not provide effective protection against "light" attack and they suffer from the drawbacks of requiring a large amount of memory space in the chip and of significantly slowing down the execution of the operations it is required to perform.

SUMMARY OF THE INVENTION

One object of the invention is to provide a semiconductor chip for a chip-containing portable article, which chip is not sensitive to the action against electromagnetic radiation in the ultraviolet, visible and infrared ranges.

According to one aspect of the invention, the chip comprises a silicon substrate layer whose active face has circuits integrated therein defining a central processor unit and memories. The chip further comprises physical means for providing physical protection against the action of electromagnetic radiation in the infrared range at a wavelength longer than 1 µm. For example, an additional layer of monocrystalline silicon covers at least part of the active face.

Specifically, these physical means for providing protection against the action of electromagnetic radiation are dopants for silicon, or they are formed by surface irregularities or by at least one metal layer.

BRIEF DESCRIPTION OF THE DRAWINGS

The invention will be better understood on reading the following non-limiting description given with reference to the accompanying drawings, in which.

DETAILED DESCRIPTION OF THE DRAWINGS

The present invention deals by way of example with smart cards, nevertheless, the invention naturally applies in general to any integrated circuit device for incorporation in a portable article, such as a subscriber identity module (SIM) of mini-card format, or an electronic label.

A smart card is a standard portable article operating with and/or without contact and it is defined in particular in ISO standards 7810 and 7816, the content of which is incorporated in the present description by reference.

Figure 1:
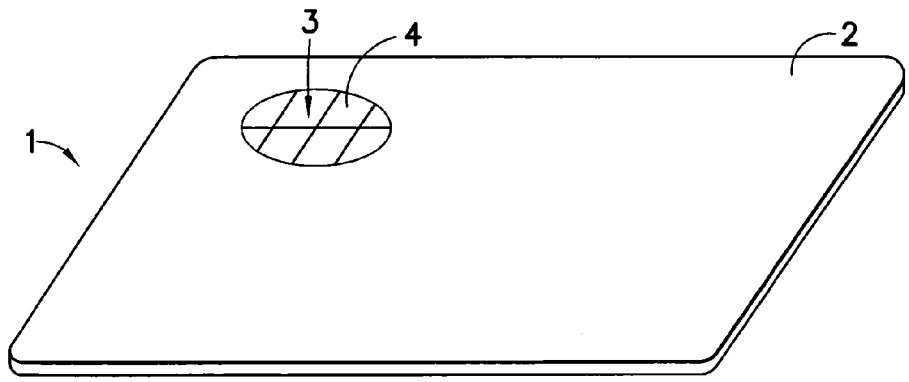
FIG. 1 is a perspective view of a card having a chip of the invention.

As shown in FIG. 1, a smart card comprises firstly a plastics card body 2 and secondly an electronic module 3 having contact areas 4 lying flush with the surface of the card body 2.

The card body 2 is made of plastics material which can be thermoplastic or thermosetting. It is in the form of a flat rectangular parallelepiped having dimensions which are about 85 millimeters (mm) long, 54 mm wide, and 0.76 mm thick.

Figure 2:
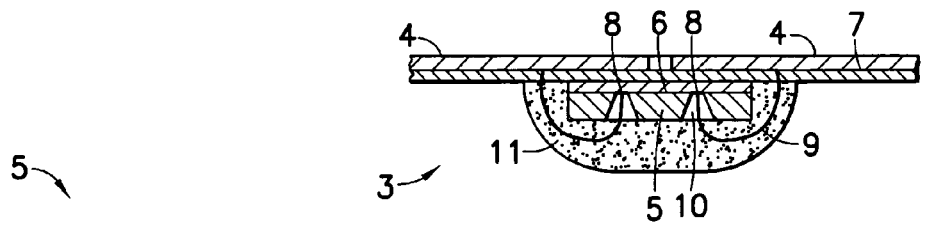
FIG. 2 is a perspective view of a module including a chip of the invention.

The electronic module 3 shown in FIG. 2 comprises an integrated circuit or chip device 5 fixed via its rear surface 6 to a thickness 7 of epoxy that carries the contact areas 4. Contact pads 8 on the chip 5 are electrically connected to said areas 4 by means of metal wires passing through holes 10 opening out through the thickness 7 of epoxy. The assembly comprising the chip 5 and the wires 9 is embedded in a protective resin 11.

Chips 5 of the invention are in the form of small rectangular parallelepipeds, in practice having a side of about 2 mm and a thickness of a few hundreds of microns (µm), e.g. 200 µm. There are two main types.

Figure 3A:
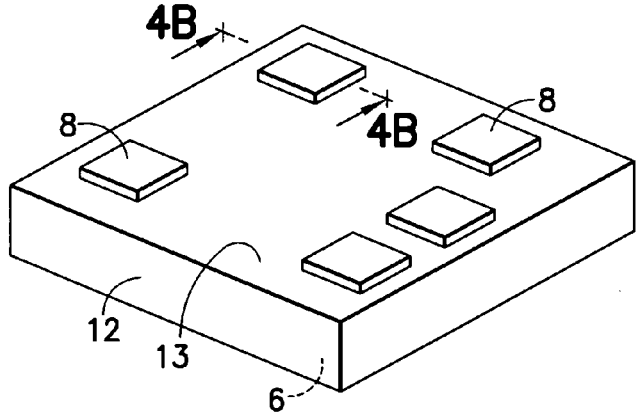
FIGS. 3A and 3B are perspective views showing two types of chip of the invention.

In the first type as shown in FIG. 3A, the chip 5 has a silicon substrate layer 12. This layer 12 has an active face 13 in which the circuits are integrated and a face opposite from said from said active face 13, i.e. the rear face 6. The contact pads 8 are generally five in number and they are integrated in the active face 13.

Figure 3B:
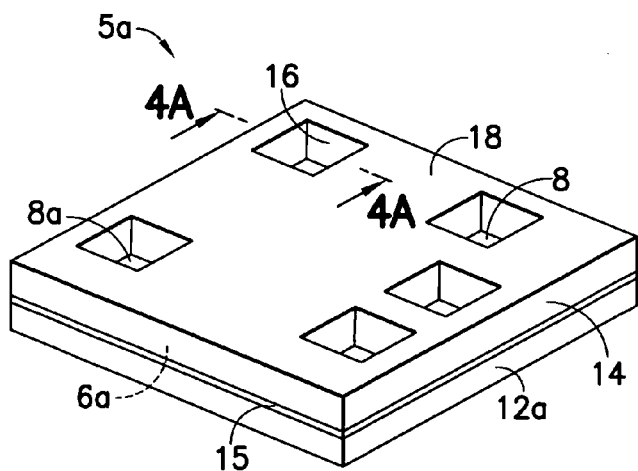

In a second type of chip 5a shown in FIG. 3B (and one variation thereof shown in FIG. 4A), the chip 5a has in similar manner a silicon substrate layer 12a whose thickness has been reduced and is therefore thinner than the silicon substrate layer 12 shown in FIG. 3A. This silicon substrate layer 12a likewise has an active face 13a which includes the integrated circuits and a face opposite said active face, i.e. the rear face 6a.

However, the active face 13a is covered in an additional layer 14 of monocrystalline silicon which is bonded to said face 13a via a bonding layer 15. The additional layer 14 has a top face 18 and a bottom face 19 in contact with the bonding layer. The bonding layer 15 and the additional layer 14 advantageously cover all or at least a major portion of the active face 13a of chip 5a with the exception of the contact pads 8a which remain accessible through openings 16, or "vias", formed through said layers 14 and 15. In practice, the thickness of the various layers are as follows. Thinned substrate layer: about 15 µm; additional layer: about 150 µm; and bonding layer: about 10 µm.

Whatever its type, the chip 3 of the invention has physical means providing physical protection against the action of light, i.e. against the action of electromagnetic radiation in the ultraviolet, visible, and infrared ranges, said ranges being defined as follows by wavelength:
 ultraviolet: 10 nanometers (nm)<λ<400 nm;
 visible: 400 nm<λ<700 nm; and
 infrared: 0.7 µm<λ<0.1 mm.

Figure 4A:
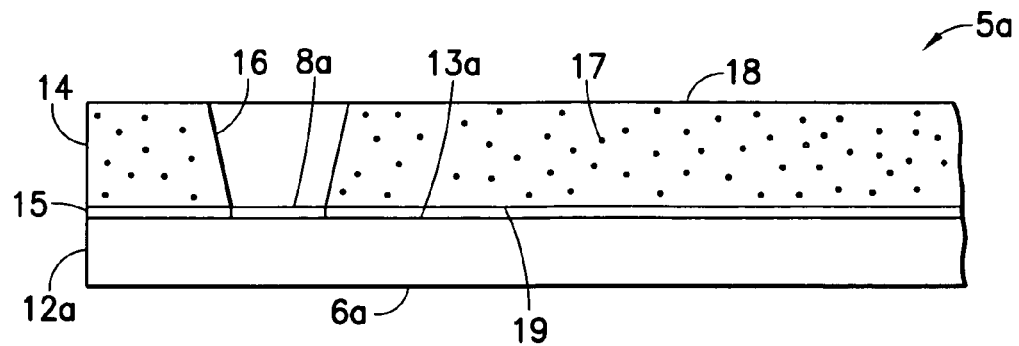
FIG. 4A is one variation of a cross section taken along line 4A-4A of FIG. 3B.
Figure 4B:
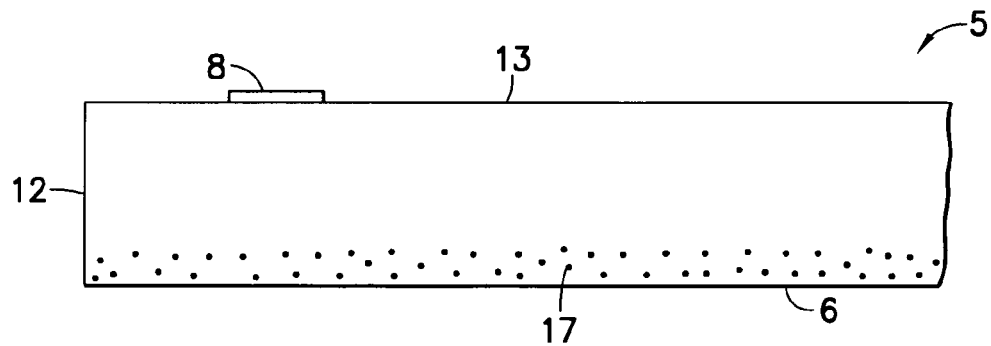
FIG. 4B is a cross section taken along line 4B-4B of FIG. 3A.
Figure 4C:
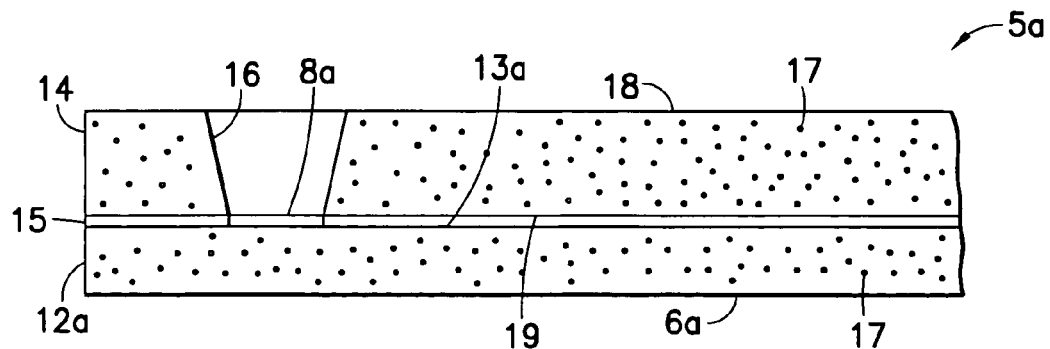
FIG. 4C is another variation of a cross section taken along line 4A-4A of FIG. 3B.

In a first embodiment of the invention as shown in FIGS. 4A, 4B, and 4C, these means are silicon dopants 17.

Figure 5A:
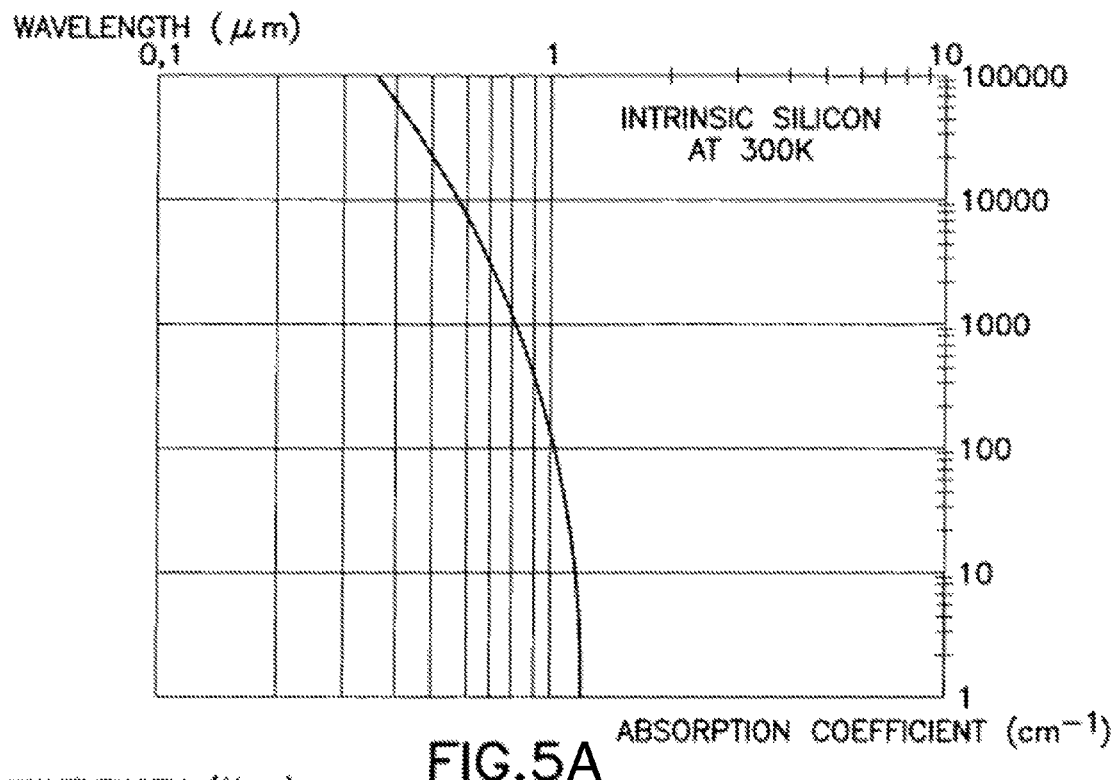
FIGS. 5A and 5B are graphs showing the extent to which the means of the invention provide the chip with protection against the action of light.

In an intrinsic silicon crystal, all or nearly all of the atoms are silicon atoms. As shown in FIG. 5A, an intrinsic silicon crystal at 300 Kelvins (K) is opaque to electromagnetic radiation in most of the visible and ultraviolet spectrum at a wavelength longer than 0.7 µm, having an absorption coefficient greater than 100 cm$^{-1}$. However, this absorption coefficient falls off very considerably at wavelengths greater than 1 µm, i.e. for the portion of the electromagnetic spectrum that corresponds substantially to the infrared range. Infrared radiation therefore penetrates intrinsic silicon.

Figure 5B:
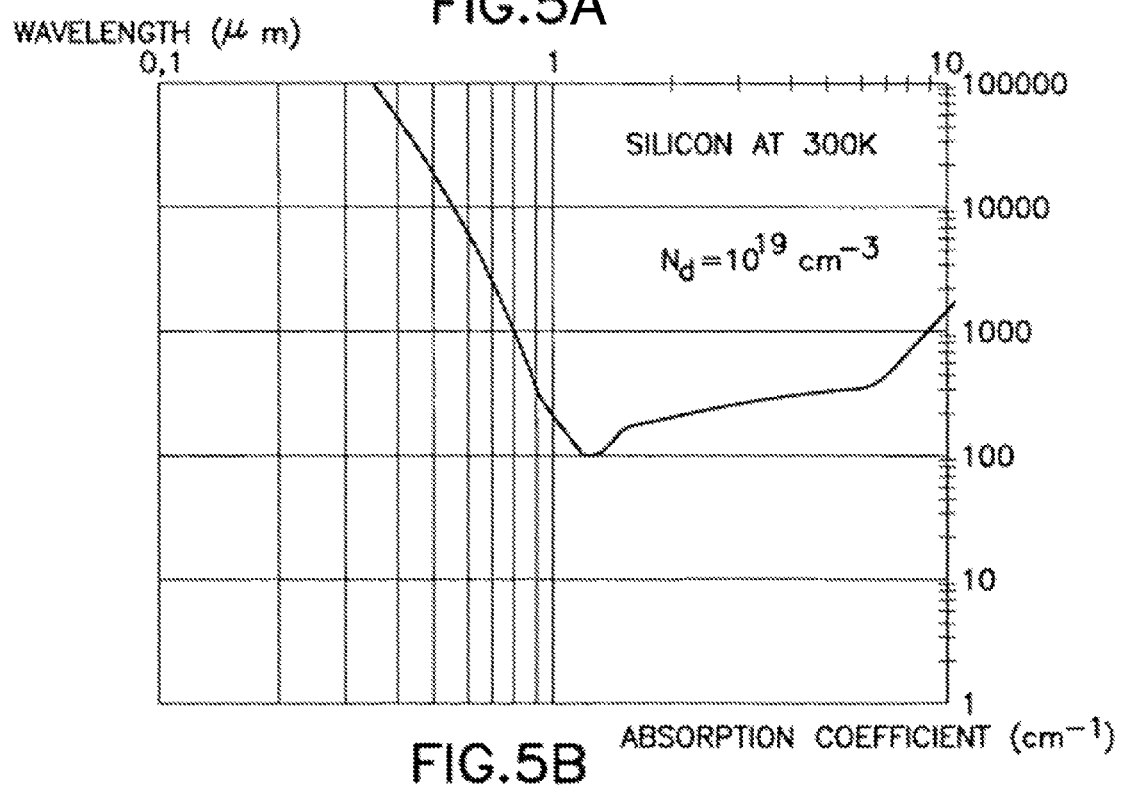

As shown in FIG. 5B, in the presence of dopants 17 at a concentration of $N_d=10^{19}$ atoms per cm$^3$, the light absorption coefficient remains greater than 100 cm$^{-1}$, not only at wavelengths shorter than 1 µm, but also at longer wavelengths. It can even be seen that the absorption coefficient increases at wavelengths rising from 1 µm to 10 µm.

Thus, the dopants conventionally used for changing the semiconductive properties of silicon are capable of changing the absorption properties of an intrinsic crystal of silicon so that its absorption coefficient increases significantly at wavelengths longer than 1 µm, i.e. in particular, at wavelengths in the infrared range.

In the invention, the dopants 17 are atoms whose chemical nature is different from that of silicon such that the presence thereof gives rise to defects in its crystal lattice. They can be atoms of phosphorus or of boron, for example. The number of dopant atoms present in the silicon lies in the range $10^{17}$ to $10^{20}$ atoms per cm$^3$, and is preferably about $10^{19}$ atoms per cm$^3$. Light absorption at given wavelength and thickness increases with increasing concentration of dopant.

The dopants 17 can be incorporated in the crystal lattice while the silicon crystal is being grown, or else they can be the subject of high temperature diffusion under an inert atmosphere, or they can be the subject of ion implantation.

The dopants 17 can be present in the silicon substrate layer 12 of a chip 5 of the first type or of a chip 5a of the second type. They can also be incorporated in the additional layer 14 of a chip 5a of the second type.

In the variant of FIG. 4A which shows a chip 5a of the second type, the dopants 17 are present in the additional layer 14 of the chip 5a. They are uniformly distributed throughout this layer 14. Nevertheless, they can be concentrated solely in a fraction of the thickness of said layer 14, in particular in the portion of said layer that is close to its top face 18.

In the variant of FIG. 4B which shows a chip 5 of the first type, the dopants 17 are present in the substrate layer 12 of the chip 5. These dopants are concentrated in the rear portion of said layer 12. Thus, the effects of the dopants on electrical conduction do not interfere with proper operation of the integrated circuits on the active face 13 of the chip 5.

In the variant of FIG. 4C which shows a chip 5a of the second type, the dopants 17 are present both in the substrate layer 12a of the chip and in its additional layer 14.

In a second embodiment of the invention as shown in FIGS. 6A, 6B, 6C and 6D the means providing physical protection against the action of light are formed by surface irregularities 20 visible on a face of a layer of silicon. These surface irregularities can be visible on the rear face of the silicon substrate or on one or two of the top and bottom faces of the additional layer 14 for chips 5a of the second type.

By way of example, these surface irregularities 20 are constituted by recesses and projections formed over the entire surface in question of the substrate or additional layer. The height of these recesses and projections is the order of a few microns.

In practice, the irregularities 20 are formed by etching the silicon, e.g. by means of a dry technique such as mechanical abrasion, or a wet technique such as potassium hydroxide (KOH) machining.

Focused incident electromagnetic radiation, and in particular such electromagnetic radiation having a wavelength longer than 1 µm, in particular infrared radiation, is reflected in part by the irregular walls of the silicon and is subject in part to refraction. By being reflected, attenuated, and diffused in this way, the radiation no longer reaches the intended targets of the attacker and the attacker can no longer predict which targets will finally be reached. This makes the attacks impossible.

Figure 6A:
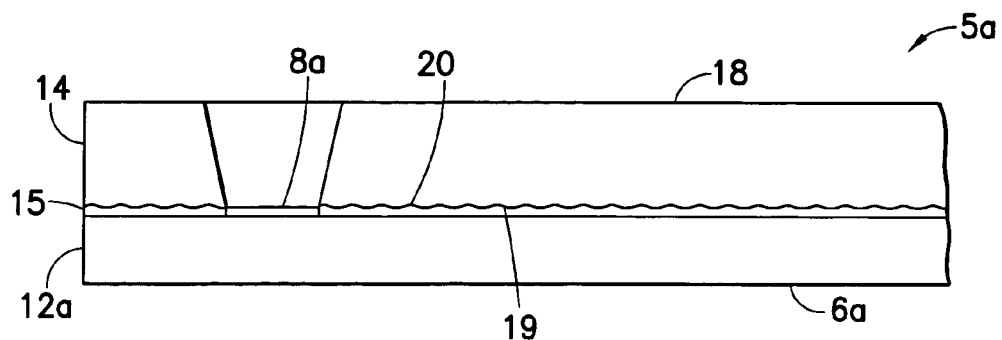
FIG. 6A is a variant of a second embodiment taken along a cross section similar to that of FIG. 4A.

In the variant of FIG. 6A which shows a chip 5a of the second type, the irregularities 20 are formed on the face of the additional layer 14 which comes into contact with the bonding layer 15.

Figure 6B:
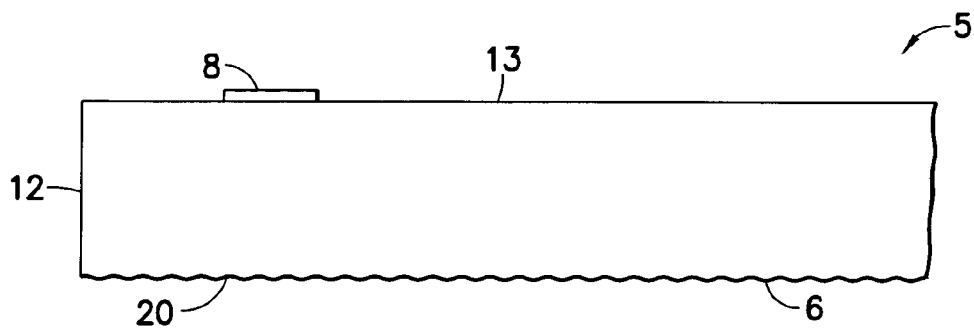
FIG. 6B is a second embodiment taken along a cross section similar to FIG. 4B.

In the variant of FIG. 6B which shows a chip 5 of the first type, the irregularities 20 are formed in the rear face of the silicon substrate layer.

Figure 6C:
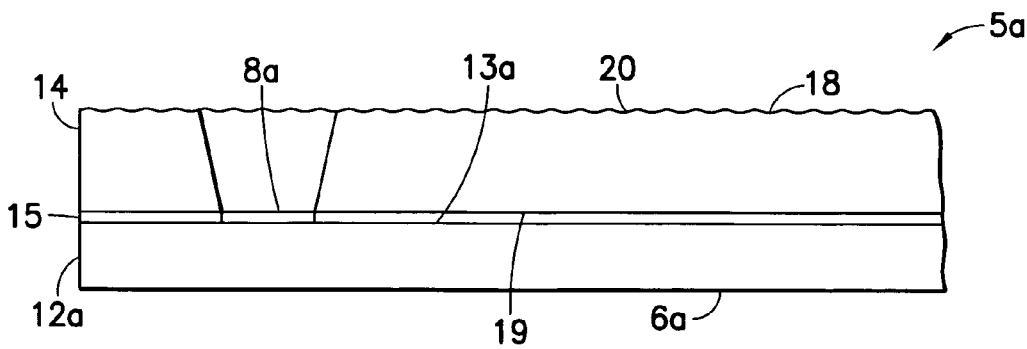
FIG. 6C is another variant of the second embodiment as shown in FIG. 6A.

In the variant of FIG. 6C which shows a chip 5a of the second type, the irregularities 20 are formed in the face 18 of the additional layer.

Figure 6D:
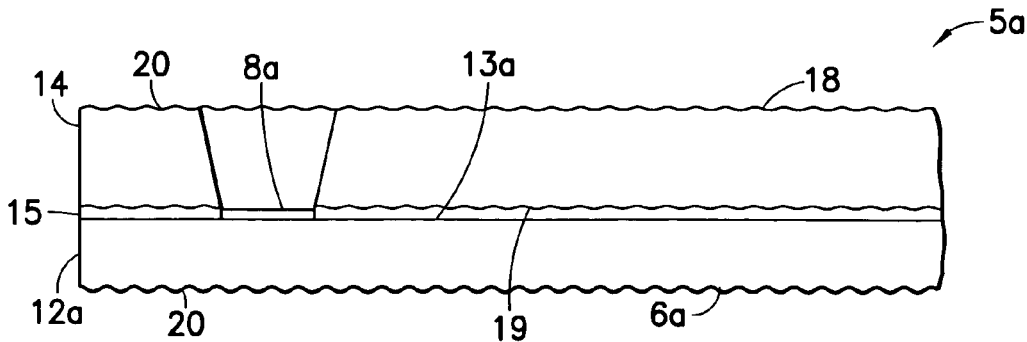
FIG. 6D is yet another variant of the second embodiment as shown in FIG. 6A.

In the variant of FIG. 6D which shows a chip 5a of the second type, the irregularities 20 are formed in the top face 18 of the additional layer 14, in its bottom face 19, and in the rear face 6a of the chip 5a.

In a third embodiment of the invention shown in FIGS. 7A, 7B, 7C and 7D the physical protection means are formed by a metal layer 21 assembled on at least one of the faces of the substrate or additional layers 12 or 14 of monocrystalline silicon having a thickness of more than 50 Ånstroms (Å), e.g. about 100 Å.

By way of example, this can be a layer of aluminum, or palladium, or a layer made up of a superposition of metal sub-layers, e.g. nickel, of chromium, and of gold.

A face can be metallized by vacuum deposition.

The layer of metal reflects or absorbs all of the incident light that is intended to illuminate the circuits. It is no longer possible to use an optical microscope to inspect the active surface of the integrated circuit nor is it possible to observe it using infrared techniques.

Figure 7A:
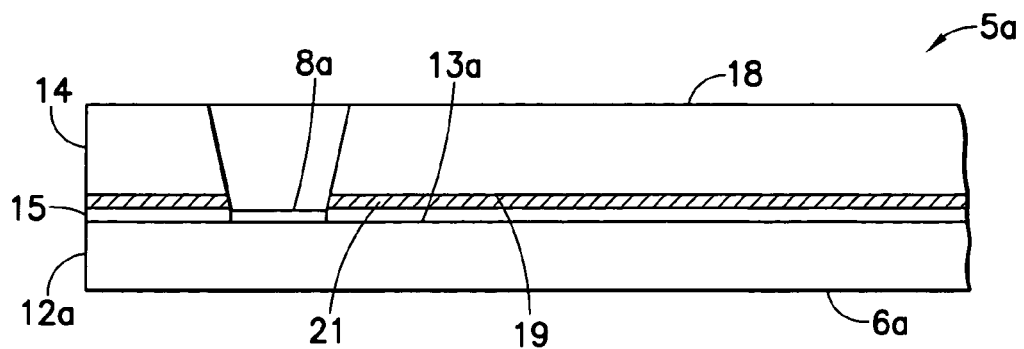
FIG. 7A is a variant of a third embodiment taken along a cross section similar to that of FIG. 4A.

In the variant of FIG. 7A which shows a chip of the second type, the metal layer 21 is placed between the additional layer 14 and the bonding layer 15.

Figure 7B:
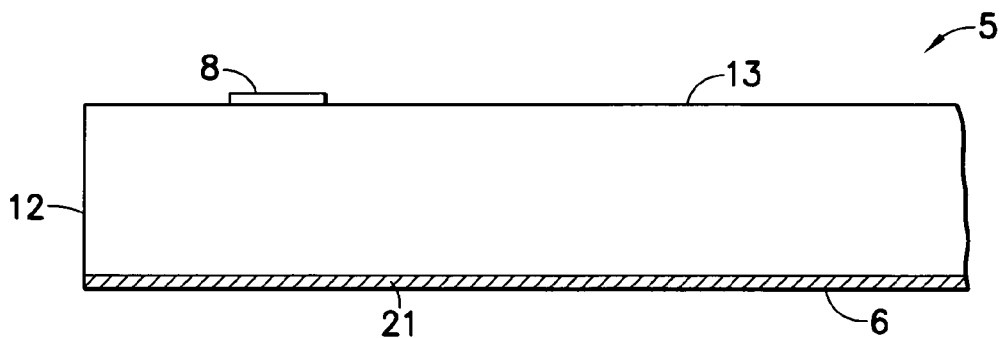
FIG. 7B is a third embodiment taken along a cross section similar to FIG. 4B.

In the variant of FIG. 7B which shows a chip 5 of the first type, the metal layer 21 is placed on the rear face of the substrate layer 12.

Figure 7C:
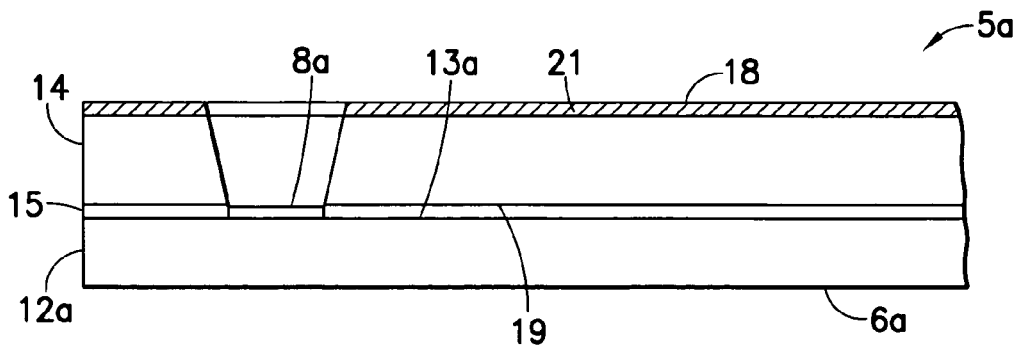
FIG. 7C is another variant of the third embodiment as shown in FIG. 7A.

In the variant of FIG. 7C which shows a chip 5a of the second type, the metal layer 21 is placed on the top face 18 of the additional layer 14.

Figure 7D:
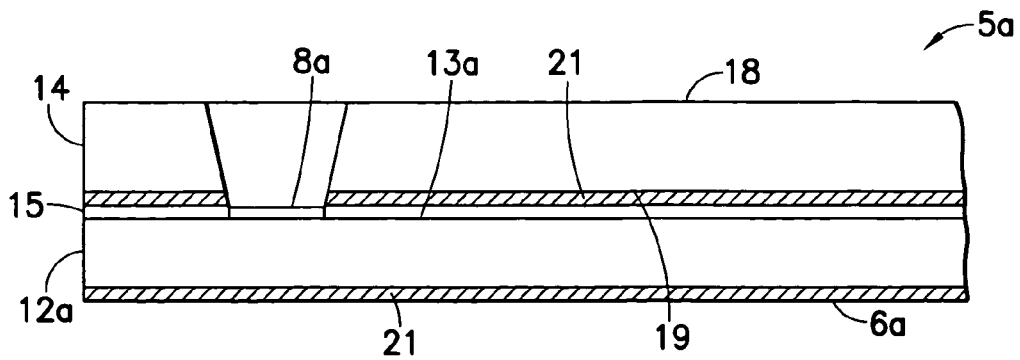
FIG. 7D is yet another variant of the third embodiment as shown in FIG. 7A.

In the variant of FIG. 7D which shows a chip 5a of the second type, a first metal layer is placed between the additional layer 14 and the bonding layer 15, and a second metal layer is placed on the rear face of the substrate layer 12a.

Naturally, the invention is not limited to the above-described variants. In addition, it is possible to use different protection means in the same chip 5.

It will be observed that installing an additional layer on the active face of a chip of the first type and/or installing the above-mentioned means for protecting the circuits against the action of light can take place in steps that are subsequent to the conventional steps for producing integrated circuits. As a result, conventional chip manufacturing lines can be conserved. Furthermore, a chip of the invention, whether of the first or second type, has substantially the same dimensions as conventional chips in the state of the art. As a result lines for manufacturing modules can be conserved to operate with chips of the invention.

It will also be observed that the means providing physical protection against the action of light can cover all of the integrated circuits or only some of them. When only certain portions of said integrated circuits are covered, those portions are advantageously key portions, i.e. portions which are sensitive to attack by light and in which a disturbance produced by such light could be harmful to the integrity of the chip and the secrets it contains. In particular, such key portions can be constituted by the voltage multiplier used for programming the EEPROM memory cells, the amplifiers for reading the content of memories, and some of the registers of the volatile memory (RAM) or of the central processor unit (CPU).

The invention claimed is:

1. A chip for a chip-containing portable article comprising:
    a silicon substrate layer having an active face with circuits integrated therein defining a central processor unit and memories;
    an additional layer of monocrystalline silicon that:
        covers a portion of an integrated circuit integrated on said active face;
        comprises physical means for providing physical protection against the action of electromagnetic radiation in the infrared range at a wavelength longer than 1 µm; and
    a bonding layer in contact with the active face and the additional layer such that at least one contact pad of the chip is exposed by a via opening in the additional layer and the bonding layer or a bonding layer in contact with the active face and the additional layer such that the entire silicon substrate layer is covered by the additional layer.

2. A chip according to claim 1, wherein the physical means for providing physical protection against the action of electromagnetic radiation are silicon dopants.

3. A chip according to claim 2, wherein the concentration of silicon dopants lies in the range $10^{17}$ to $10^{20}$ atoms per $cm^3$.

4. A chip according to claim 2, wherein the silicon dopants are phosphorus or boron.

5. The chip according to claim 2 wherein the silicon substrate layer comprises:
    physical means for providing physical protection against the action of electromagnetic radiation in the infrared range at a wavelength longer than 1 µm; and
    wherein said physical means comprises silicon dopants in the face of the silicon substrate layer that is opposite to the active face.

6. The chip according to claim 5, wherein the concentration of silicon dopants in the silicon substrate layer lies in the range $10^{17}$ to $10^{20}$ atoms per $cm^3$.

7. The chip according to claim 6, wherein the silicon dopants in the silicon substrate layer are phosphorus or boron.

8. A chip according to claim 1, wherein the physical means for providing physical protection against the action of electromagnetic radiation are formed by surface irregularities.

9. A chip according to claim 8, wherein the surfaces irregularities are provided in the face of the additional layer of monocrystalline silicon that is in contact with the bonding layer.

10. A chip according to claim 8, wherein the surface irregularities are provided in the face of the additional layer of montcrystalline silicon that is opposite to the face that is in contact with the bonding layer.

11. A chip according to claim 8 wherein the silicon substrate layer comprises:
    physical means for providing physical protection against the action of electromagnetic radiation in the infrared range at a wavelength longer than 1 µm: and
    wherein said physical means comprises surface irregularities in the face of the silicon substrate layer that is opposite to the active face.

12. A chip according to claim 1, wherein the physical means for providing physical protection against the action of electromagnetic radiation are formed by at least one deposition of metal on the additional layer of moncrystalline silicon.

13. A chip according to claim 12, wherein the metal deposition has a thickness greater than 50 Å.

14. A chip according to claim 12, wherein the metal deposition is on the face of the additional of monocrystalline silicon that is in contact with the bonding layer.

15. A chip according to claim 14, wherein the metal deposition has a thickness of about 100 Å.

16. A chip according to claim 12, wherein the metal deposition is on the face of the additional layer of monocrystalline silicon that is opposite to the face that is in contact with the bonding layer.

17. A chip according to claim 12 wherein the silicon substrate layer comprises:
 physical means for providing physical protection against the action of electromagnetic radiation in the infrared range at a wavelength longer than 1 µm; and
 wherein said physical means comprising deposition of metal on the face of the silicon substrate layer that is opposite to the active face.

18. A chip for a chip-containing portable article of claim 1 further comprising:
 physical means for providing physical protection against the action of electromagnetic radiation in the infrared range at a wavelength longer than 1 µm comprising silicon dopants in a region adjacent to the face of the silicon substrate layer that is opposite to the active face.

19. A chip according to claim 18, wherein the concentration of silicon dopants in the region adjacent to the face of the silicon substrate layer that is opposite to the active face lies in the range $10^{17}$ to $10^{20}$ atoms per cm$^3$.

20. A chip according to claim 19, wherein the silicon dopants in a region adjacent to the face of the silicon substrate layer that is opposite to the active face are phosphorus or boron.

21. A chip for a chip-containing portable article of claim 1 further comprising:
 physical means for providing physical protection against the action of electromagnetic radiation in the infrared range at a wavelength longer than 1 µm comprising surface irregularities in the face of the silicon substrate layer that is opposite to the active face.

22. A chip for a chip-containing portable article of claim 1 further comprising:
 physical means for providing physical protection against the electromagnetic radiation in the infrared range at a wavelength longer than 1 µm comprising deposition of metal on the face of the silicon substrate layer that is opposite to the active face.

23. A chip according to claim 22, wherein the metal deposition has a thickness greater than 50 Å.

24. A chip according to claim 22, wherein the metal deposition has a thickness of about 100 Å.

25. The chip of claim 1 wherein the at least a portion is a key portion of the circuits integrated therein sensitive to attack by light and in which disturbance by light may be harmful to the integrity of the chip and the secrets contained in the chip.

26. The chip of claim 25 wherein the key portion is selected from the set including the members a voltage multiplier used for programming EEPROM memory cells, the amplifiers for reading the contents of memories, a register of a volatile memory of the chip, and the central processing unit.

27. A portable article provided with a chip comprising:
 a silicon substrate layer having an active face with circuits integrated therein defining a central processor unit and memories; and
 an additional layer of moncrystalline silicon that:
  covers at least a portion of an integrated circuit integrated on said active face;
  comprises physical means for providing physical protection against the action of electromagnetic radiation in the infrared range at a wavelength longer than 1 µm; and
  a bonding layer in contact with the active face and the additional layer such that at least one contact pad of the chip is exposed by a via opening in the additional layer and the bonding layer or a bonding layer in contact with the active face and the additional layer such that the entire silicon substrate layer is covered by the additional layer.

28. The portable article of claim 27 wherein the at least a portion is a key portion of the circuits integrated therein sensitive to attack by light and in which disturbance by light may be harmful to the integrity of the chip and the secrets contained in the chip.

29. The portable article of claim 28 wherein the key portion is selected from the set including the members a voltage multiplier used for programming EEPROM memory cells, the amplifiers for reading the contents of memories, a register of a volatile memory of the chip, and the central processing unit.

* * * * *